(12) United States Patent
Chaudhry et al.

(10) Patent No.: US 9,088,274 B1
(45) Date of Patent: Jul. 21, 2015

(54) VOLTAGE CLAMPING CIRCUIT

(71) Applicants: Nidhi Chaudhry, Bangalore (IN); Parul K. Sharma, Noida (IN)

(72) Inventors: Nidhi Chaudhry, Bangalore (IN); Parul K. Sharma, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 71 days.

(21) Appl. No.: 14/164,252

(22) Filed: Jan. 26, 2014

(51) Int. Cl.
*H03K 5/08* (2006.01)

(52) U.S. Cl.
CPC .......................................... *H03K 5/08* (2013.01)

(58) Field of Classification Search
CPC ........................................................ H03K 5/08
USPC .................. 327/309, 315, 318, 319, 327, 328
See application file for complete search history.

(56) References Cited

U.S. PATENT DOCUMENTS

| | | | |
|---|---|---|---|
| 4,525,637 A | 6/1985 | Sano | |
| 5,561,391 A | 10/1996 | Wellnitz | |
| 5,847,591 A | 12/1998 | Schnell | |
| 6,043,702 A * | 3/2000 | Singh | ............................. 327/534 |
| 6,400,546 B1 * | 6/2002 | Drapkin et al. | ............... 361/111 |
| 6,600,346 B1 | 7/2003 | Macaluso | |
| 7,254,003 B2 | 8/2007 | Lau | |
| 7,518,352 B2 | 4/2009 | De Lima | |
| 7,532,445 B2 | 5/2009 | Rana | |
| 8,111,047 B2 | 2/2012 | Betty | |
| 8,493,122 B1 | 7/2013 | Chaudhry | |

OTHER PUBLICATIONS

Chand, Jagdish, et al., "High Voltage Protection for USB Transceivers in 45nm CMOS" Circuits and Systems (ISCAS), IEEE International Symposium, 2011.

* cited by examiner

*Primary Examiner* — William Hernandez
(74) *Attorney, Agent, or Firm* — Charles Bergere

(57) ABSTRACT

A voltage clamping circuit that is implemented using low voltage devices provides a way to discharge an input/output pin to ground during overvoltage conditions and to avoid any interaction between the input/output pin and the input/output supply during clamping action. The voltage clamping circuit is also self-protected. A voltage detection circuit detects an overvoltage condition and in response generates a signal that turns on a PMOS, which in turn provides a clamping current path between the input/output pin and ground.

9 Claims, 1 Drawing Sheet

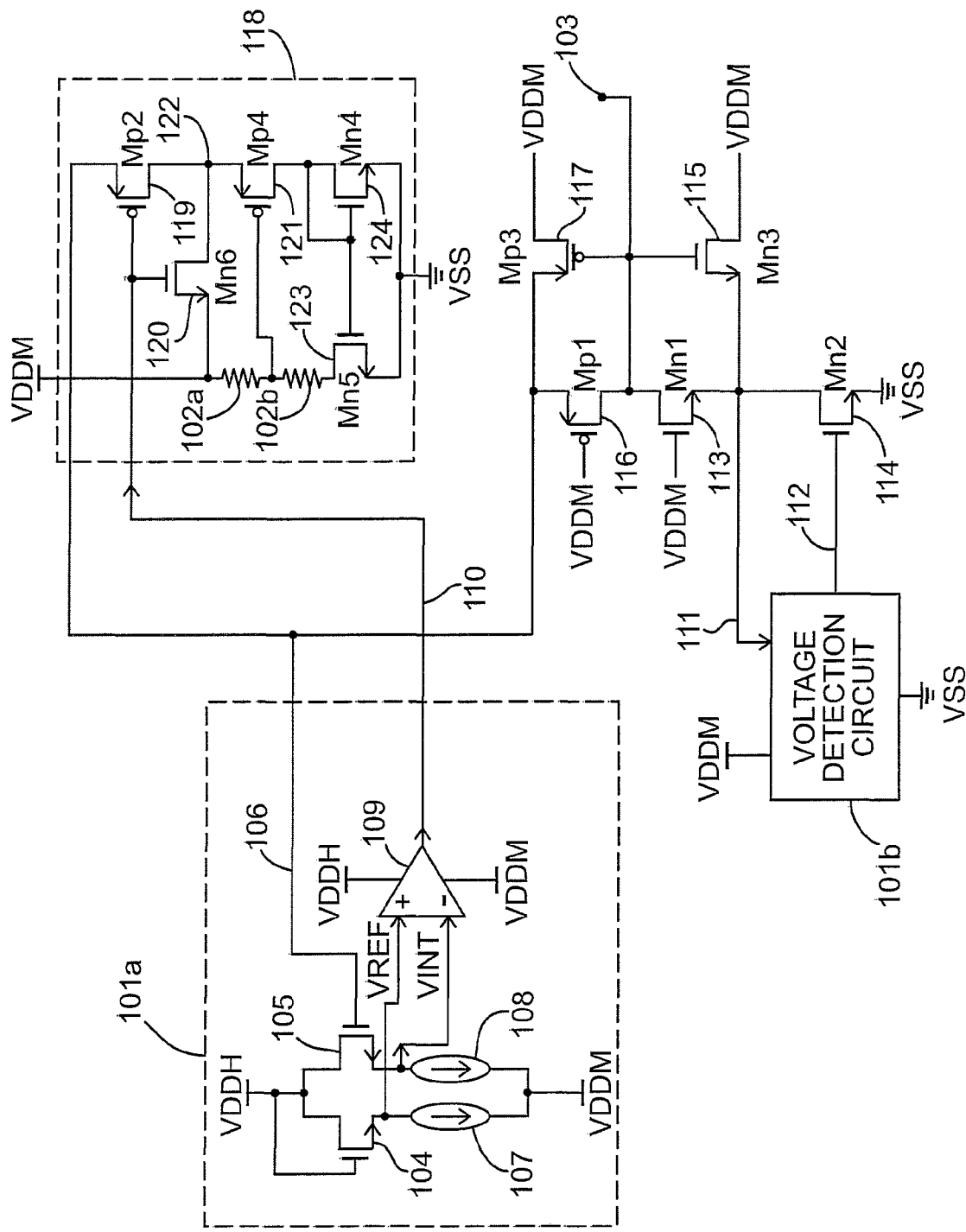

VOLTAGE CLAMPING CIRCUIT

BACKGROUND OF THE INVENTION

The present invention relates generally to voltage clamping circuits, and more particularly to voltage clamping circuits that include low voltage devices.

Input/output (I/O) circuits are used to input and output electrical signals to and from integrated circuits and are usually coupled to one more I/O pins of an integrated circuit. I/o pins receive signals from external circuits and pass received signals to the corresponding I/O circuits. The I/O circuits pass the input signals to internal circuitry of the integrated circuit. I/O circuits also pass signals received from the integrated circuit's internal circuitry to the I/O pins, which in turn transmit these signals to external circuits.

One known voltage clamping circuit (described in U.S. Pat. No. 8,493,122) includes first and second voltage detection circuits, a plurality of transistors and an I/O pin. The I/O pin is protected from voltage overshoots by three transistors and the first voltage detection circuit and is protected from voltage overshoots by a further three transistors and the second voltage detection circuit.

A drawback of the known clamping circuit is that during positive voltage surges above the I/O supply voltage, the clamping mechanism transfers current from the I/O pin to the I/O supply. This can result in a slight upward shift in the I/O supply voltage value, which may be undesirable. Accordingly, it would be advantageous to providing a clamping circuit which did not exhibit this behavior.

BRIEF DESCRIPTION OF THE DRAWINGS

The invention, together with objects and advantages thereof, may best be understood by reference to the following description of preferred embodiments together with the accompanying drawings in which:

FIG. 1 is a schematic circuit diagram of a voltage clamping circuit in accordance with an embodiment of the present invention.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a voltage clamping circuit for an I/O pin of an integrated circuit. The voltage clamping circuit includes a first transistor (MP1) having a drain terminal connected to the I/O pin and a gate terminal that receives a first voltage VDDM. The first transistor generates a first intermediate signal dependent on an input signal provided at the I/O pin when a magnitude of the input signal exceeds a predetermined threshold. A voltage detection circuit is connected to a source terminal of the first transistor for detecting a voltage thereon and generating a second intermediate signal having a magnitude equal to the first voltage when a reference threshold condition is met. A second transistor (MP2) has a source terminal connected to a source terminal of the first transistor for receiving the first intermediate signal and a gate terminal connected to the voltage detection circuit for receiving the second intermediate signal and for providing a current path between the I/O pin, via the first transistor, to ground when the input signal exceeds the predetermined threshold. A third transistor MN6) has a gate terminal connected to the voltage detection circuit for receiving the second intermediate signal, a source terminal that receives the first voltage VDDM and a drain terminal connected to a drain terminal of the second transistor for setting the drain terminal of the second transistor to the first voltage VDDM during a normal mode of operation of the input/output pin.

The voltage clamping circuit may be implemented in an integrated circuit. The voltage clamping circuit may be incorporated in an integrated circuit that includes other functionality.

The invention provides a way to discharge an input/output pin to ground during overvoltage conditions and to avoid any interaction between the input/output pin and the input/output supply during clamping action. A voltage clamping circuit in accordance with an embodiment of the present invention is also self-protected.

As the invention provides a way of avoiding interference with the input-/output supply voltage during overvoltage clamping, no current sinking or system-level regulator requirements need to be taken into account Referring now to FIG. 1 there is illustrated an embodiment of a voltage clamping circuit 100 which includes a first voltage detection circuit 101a, a second voltage detection circuit 101b, a resistor arrangement 102a, 102b a plurality of transistors (to be described in greater detail below) and an input/output (I/O) pin 103.

The first voltage detection circuit 101a serves to detect voltage overshoots and the second voltage protection circuit 101b serves to detect voltage undershoots. The first voltage detection circuit 101a is provided with supply voltages of VDDH and VDDM. The second voltage detection circuit 101b is provided with supply voltages VDDM and VSS, (VSS being grounded). The input/output pin 103 may be typically connected to an input/output circuit (not shown) that includes one or more low voltage devices (which may comprise integrated circuits). The input/output pin 103 transmits and receives input/output signals to and from an input/output circuit (not shown). In an embodiment of the invention, VDDH is the input/output supply voltage (for example, VDDH may be typically 3.3 Volt) and the voltage VDDM is less than VDDH, being an intermediate voltage used as a protection voltage. In one embodiment, VDDM is equal to the voltage rating of the devices used in the input/output circuit 100 (for example 1.8 Volt). The first and second voltage detection circuits 101a and 101b may be configured as described in U.S. Pat. No. 8,493,122. Only the first voltage detection circuit 101a is shown in any detail in FIG. 1.

Referring then in more detail to the first detection circuit 101a, drain terminals of first and second transistors 104 and 105 and a gate terminal of the first transistor 104 are provided with the supply voltage VDDH. A gate terminal of the second transistor 105 is connected to an input line 106 of the first voltage detection circuit 101a. First and second current sources 107 and 108 are connected between source terminals of the first and second transistors 104, 105 respectively and the supply voltage VDDM. The first and second current sources 107 108 generate first and second currents respectively where the second current from source 108 is greater than the first current from source 107 by a predetermined value (for example 20%). The source terminals of the first and second transistors 104 and 105 are connected to positive and negative terminals respectively of a comparator 109 and provide a reference voltage VREF and an intermediate voltage VINT at the positive and negative terminals. The comparator 109 is also provided with supply voltages of VDDH and VDDM. An output terminal of the comparator 109 is connected to an output line 110 and serves as a transistor gate bias in a manner to be described below.

The first and second transistors 104 and 105 are connected in a source-follow configuration. As a result, voltages at the source terminals of the first and second transistors 104 and 105 (i.e., VREF and VINT respectively), follow the voltages at the gate terminals of the first and second transistors 104 and 105. As long as the voltage at the gate terminal of the second transistor 105 (that is the input line 106 to the first voltage detection circuit) is less than the supply voltage VDDH, then the intermediate voltage VINT is less than the reference voltage VREF which causes the comparator to output voltage VDDH on line 110. However, should the voltage at the gate terminal of the second transistor 105 (the input to the comparator online 106) exceed the voltage VDDH, then the intermediate voltage VINT exceeds the reference voltage VREF causing the comparator 109 to trip and to output the voltage VDDM on line 106.

The second voltage detection circuit 101b operates in a similar fashion to the first voltage detection circuit 101a and has an input on line 111 and an output on line 112. The second voltage detection circuit 101 outputs a voltage on line 112 depending on the voltage on its input line 111. The input line 111 is connected to the source terminal of a third transistor 113, to the drain terminals of a fourth transistor 114 and to the source terminal of a fifth transistor 115. The output of the second voltage detection circuit 101b is connected to the gate terminal of the fourth transistor 114. The source of the fourth transistor is connected to VSS (which is grounded). The gate terminal of the third transistor 113 is connected to VDDM and its drain terminal is connected to the input/output pin 103. The drain terminal of the fifth transistor 115 is connected to VDDM and its gate terminal is connected to the input/output pin 103. The second voltage detection circuit and third and fourth transistors act to clamp the input/output pin voltage in the event of an undershoot.

In one embodiment of the invention, the third, fourth and fifth transistors 113, 114 and 115 are N-Channel metal oxide semiconductors transistors. In an alternative embodiment, the third, fourth and fifth transistors 113, 114 and 115 are NPN bipolar junction transistors.

The second voltage detection circuit 101b outputs ground potential VSS as long as the voltage on its input line 111 (which follows the voltage at the input/output pin 103) is greater than 0 Volt. When the voltage on its input line 111 is less than 0 Volt it outputs the voltage VDDM. When this condition occurs, the fourth transistor 114 is turned on and forms a current path between ground and the input/output pin 103, thereby clamping the voltage at the input/output pin 103.

A sixth transistor 116, which in one embodiment is a P-Channel metal oxide semiconductor transistor, has its gate terminal connected to VDDM, its drain terminal connected to the input/output pin 103 and its source terminal connected to the input line 106 of the first voltage detection circuit 101a. A seventh transistor 117, which in one embodiment is a P-channel metal oxide semiconductor transistor, has its source terminal connected to the input line 106 of the first voltage detection circuit, its drain terminal connected to VDDM and its gate terminal connected to the input/output pin 103. The normal range of the voltage applied to the input/output pin 103 is from 0 Volt to VDDH. When a voltage at the input/output pin 103 is between 0 volt and VDDM, the seventh transistor 117 is turned on. This results in a voltage VDDM being applied to the source terminal of the sixth transistor 116. As a voltage VDDM is also applied to the gate terminal of the sixth transistor 116, the sixth transistor 116 enters the deep cut-of region which leads to protection of the sixth transistor 116. When the voltage at the input/output pin 103 is above VDDM, the sixth transistor 116 turns on and its source terminal follows the voltage at the input/output pin 103.

As mentioned above, the clamping circuit 100 can also provide protection against voltage overshoots and advantageously, without transferring any current from the input/output pin to the input/output supply VDDH. This is facilitated by the first voltage detection circuit 101a, the sixth transistor 116 and a sub-circuit designated as 118 in FIG. 1.

The sub-circuit 118 includes an eighth transistor 119 whose source terminal is connected to the source terminal of the sixth transistor 116 (and so to the input line 106 of the first voltage detection circuit 101a). The gate terminal of the eighth transistor 119 is connected to the output line 110 of the first voltage detection circuit 101a (i.e., to the output of the comparator 109) and also to the gate terminal of a ninth transistor 120. The drain terminal of the eighth transistor 119, the drain terminal of the ninth transistor 120 and the source terminal of a tenth transistor 121 are all connected together at a node 122. The source terminal of the ninth transistor 120 and a first end of a first resistor 102a are connected to VDDM. A second end of the first resistor 102a is connected to a first end of a second resistor 102b and to the gate terminal of the tenth transistor 121. A second end of the second resistor 102b is connected to the drain terminal of an eleventh transistor 123 whose source terminal is connected to VSS. The drain terminal of the tenth transistor 121 is connected to the gate terminal of the eleventh transistor 123 and to the drain and gate terminals of a twelfth transistor 124. The source terminal of the 12th transistor 124 is connected to VSS. In one embodiment, the eighth and tenth transistors 119, 121 are P-channel metal oxide semiconductor transistors and the ninth, eleventh and twelfth transistor transistors 120, 123, 124 are N-channel metal oxide semiconductor transistors.

By virtue of the operation of the sub-circuit 118, during an overshoot or an overvoltage surge, clamping current flows to ground rather than into the input/output supply VDDH. When the voltage at the input/output pin 103 is between VDDM and VDDH, the voltage on line 106 (i.e., the input to the first voltage detection circuit 101a) follows the input/output pin voltage and the eighth transistor 119 is in the "off" state. The voltage output on output line 110 of the comparator 109 (of the first voltage detection circuit 101a) is VDDH and so this voltage of VDDH at the gate of the ninth transistor 120 turns the ninth transistor 120 on. This keeps the node 122 at the VDDM level. The gate voltage of the tenth transistor 121 will also be at VDDM during these conditions as there is no current flow through the eighth transistor 119, the tenth transistor 121 and the twelfth transistor 124.

However, when the input/output pin voltage rises above VDDM, the sixth transistor 116 is turned on. The source and drain terminals are swapped when the input/output pin voltage rises above VDDM. The voltage on line 106 follows the voltage at the source of the sixth transistor 116 minus the resistive drop of the sixth transistor 116. When the voltage on line 106 rises above VDDM plus the threshold produced by the difference between the currents from the current sources 108 and 107, the comparator trips and outputs a voltage VDDM on line 110. The eighth transistor 119 turns on. This causes current to flow from the input/output pin 103 to ground via the sixth, eighth, tenth and twelfth transistors 116, 119, 121, 124. This causes a voltage drop in the output resistance of the external voltage source resulting in clamping of the input/output pin voltage and the voltage on line 106 to VDDM. The ninth transistor 120 remains off at this time. Current flowing through the twelfth transistor 124 causes current to flow through the eleventh transistor 123 and also through the resistor 102a, 102b. This causes a voltage drop in the gate voltage of the tenth transistor 121 and biases the internal nodes such that all the transistors comprising the sub-circuit 118 remain within the reliability limits of VDDM. The values for the resistors 102a and 102b can be chosen depending on the current chosen to flow through the eleventh transistor 123.

As the input/output pin voltage decreases the comparator output trips back to VDDH and the eighth transistor 119 is turned off.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "connected," or "coupled," to each other to achieve the desired functionality.

Also for example, in one embodiment, the illustrated examples may be implemented as circuitry located on a single integrated circuit or within a same device. Such an integrated circuit may be a package containing one or more dies. Alternatively, the examples may be implemented as any number of separate integrated circuits or separate devices interconnected with each other in a suitable manner. For example, an integrated circuit device may comprise one or more dies in a single package with electronic components provided on the dies that form the modules and which are connectable to other components outside the package through suitable connections such as pins of the package and bond wires between the pins and the dies.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A voltage clamping circuit for an input/output pin of an integrated circuit, the voltage clamping circuit comprising:
   a first transistor having a drain terminal connected to the input/output pin and a gate terminal that receives a first voltage, wherein the first transistor generates a first intermediate signal dependent on an input signal provided at the input/output pin when a magnitude of the input signal exceeds a predetermined threshold;
   a voltage detection circuit connected to a source terminal of the first transistor for detecting a voltage thereon and generating a second intermediate signal having a magnitude equal to the first voltage when a reference threshold condition is met;
   a second transistor having a source terminal connected to a source terminal of the first transistor for receiving the first intermediate signal and a gate terminal connected to the voltage detection circuit for receiving the second intermediate signal and for providing a current path between the input/output pin, via the first transistor, to ground when the input signal exceeds the predetermined threshold; and
   a third transistor having a gate terminal connected to the voltage detection circuit for receiving the second intermediate signal, a source terminal that receives the first voltage and a drain terminal connected to a drain terminal of the second transistor for setting the drain terminal of the second transistor to the first voltage during a normal mode of operation of the input/output pin.

2. The voltage clamping circuit of claim 1, further comprising:
   a fourth transistor having a source terminal connected to the drain terminals of the second and third transistors and a gate terminal that receives a proportion of the first voltage and is connected to a first terminal of a first resistor whose second terminal receives the first voltage;
   a fifth transistor having a drain terminal and a gate terminal which are connected to one another and to a drain terminal of the fourth transistor, and having a source terminal connected to ground; and
   a sixth transistor having a gate terminal connected to the gate terminal of the fifth transistor, a source terminal connected to ground and a drain terminal connected to a first terminal of a second resistor whose second terminal is connected to the first terminal of the first resistor.

3. The voltage clamping circuit of claim 2, wherein the fourth transistor is a PMOS transistor and the fifth and sixth transistors are NMOS transistors.

4. The voltage clamping circuit of claim 1, wherein the voltage detection circuit comprises:
   a seventh transistor that generates a reference voltage signal;
   an eighth transistor having a gate terminal connected to the source terminal of the first transistor wherein the eighth transistor generates an internal voltage signal; and
   a comparator having positive and negative input terminals connected to the source terminals of the seventh and eighth transistors respectively, for generating the second intermediate signal dependent on the reference voltage signal and the internal voltage signal.

5. The voltage clamping circuit of claim 4, wherein the seventh and eighth transistors are NMOS transistors.

6. The voltage clamping circuit of claim 1, further comprising:
   a second voltage detection circuit;
   a ninth transistor having a drain terminal connected to the input/output pin, a gate terminal that receives the first voltage and a source terminal connected to an input of the second voltage detection circuit; and
   a tenth transistor having a source terminal that is grounded, a drain terminal connected to the source terminal of the ninth transistor and a gate terminal connected to an output of the second voltage detection circuit and providing a current path between the input/output pin and ground when the input signal provided on the input/output pin drops below a predetermined level.

7. The voltage clamping circuit of claim 6, wherein the ninth and tenth transistors are NMOS transistors.

8. The voltage clamping circuit of claim 1, wherein the first and second transistors are PMOS transistors and the third transistor is an NMOS transistor.

9. An integrated circuit including a voltage clamping circuit wherein the voltage clamping circuit comprises:
   a first transistor having a drain terminal connected to an input/output pin and a gate terminal that receives a first voltage, wherein the first transistor generates a first intermediate signal dependent on an input signal provided at the input/output pin when a magnitude of the input signal exceeds a predetermined threshold;
   a voltage detection circuit connected to a source terminal of the first transistor for detecting a voltage thereon and generating a second intermediate signal having a magnitude equal to at least one of the first voltage and a second voltage;
   a second transistor having a source terminal connected to a source terminal of the first transistor for receiving the first intermediate signal and a gate terminal connected to the voltage detection circuit for receiving the second intermediate signal and for providing a current path between the input/output pin through the first transistor to ground when the input signal exceeds the predetermined threshold; and
   a third transistor having a gate terminal connected to the voltage detection circuit for receiving the second intermediate signal, a source terminal that receives the first voltage and a drain terminal connected to a drain terminal of the second transistor for setting the drain terminal of the second transistor to the first voltage during a normal mode of operation of the input/output pin.

* * * * *